United States Patent
Lim et al.

(10) Patent No.: US 12,550,529 B2
(45) Date of Patent: Feb. 10, 2026

(54) DISPLAY DEVICE HAVING DISPLAY AREA AND TRANSPARENT AREA

(71) Applicant: LG Display Co., Ltd., Seoul (KR)

(72) Inventors: Young-Nam Lim, Paju-si (KR);
Hyun-Chul Choi, Paju-si (KR);
Kwan-Soo Kim, Paju-si (KR);
Seok-Hyun Kim, Paju-si (KR);
Jae-Hyeon Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 108 days.

(21) Appl. No.: 18/443,114

(22) Filed: Feb. 15, 2024

(65) Prior Publication Data
US 2024/0188406 A1 Jun. 6, 2024

Related U.S. Application Data

(60) Continuation of application No. 18/140,865, filed on Apr. 28, 2023, now Pat. No. 11,937,491, which is a
(Continued)

(30) Foreign Application Priority Data

Dec. 5, 2019 (KR) .......................... 10-2019-0160708

(51) Int. Cl.
*H10K 59/121* (2023.01)
*H10K 50/17* (2023.01)
(Continued)

(52) U.S. Cl.
CPC .......... *H10K 59/121* (2023.02); *H10K 59/35* (2023.02); *H10K 59/65* (2023.02);
(Continued)

(58) Field of Classification Search
CPC ...... H10K 59/121; H10K 59/35; H10K 59/65; H10K 59/8052; H10K 59/873;
(Continued)

(56) References Cited

U.S. PATENT DOCUMENTS

| | | |
|---|---|---|
| 8,963,815 B2 | 2/2015 | Park |
| 9,287,339 B2 | 3/2016 | Lee et al. |

(Continued)

FOREIGN PATENT DOCUMENTS

| | | |
|---|---|---|
| CN | 102456713 A | 5/2012 |
| EP | 2521198 A2 | 11/2012 |

(Continued)

OTHER PUBLICATIONS

Korean Intellectual Property Office, Office Action, Korean Patent Application No. 10-2019-0160708, Aug. 27, 2024, 16 pages.
(Continued)

*Primary Examiner* — Caleb E Henry
(74) *Attorney, Agent, or Firm* — Fenwick & West LLP

(57) ABSTRACT

A display device includes a substrate including a display area having first color subpixels and a transparent area inside the display area, an array layer in the display area on the substrate, a first electrode in the first color subpixels on the array layer, a first emission assisting layer on the first electrode, an emitting material layer in the first color subpixels on the first emission assisting layer, a second emission assisting layer on the emitting material layer, a deposition preventing layer in the transparent area on the second emission assisting layer, a second electrode on the second emission assisting layer, the second electrode selectively disposed in a region where the deposition preventing layer is not disposed, an encapsulating layer on the deposition preventing layer and the second electrode, a polarizing layer (Continued)

in the display area on the encapsulating layer, an auxiliary equipment in the transparent area under the substrate.

20 Claims, 8 Drawing Sheets

Related U.S. Application Data division of application No. 17/102,028, filed on Nov. 23, 2020, now Pat. No. 11,678,560.

(51) Int. Cl.
| | | |
|---|---|---|
| *H10K 59/35* | (2023.01) | |
| *H10K 59/65* | (2023.01) | |
| *H10K 59/80* | (2023.01) | |

(52) U.S. Cl.
CPC ....... *H10K 59/8052* (2023.02); *H10K 59/873* (2023.02); *H10K 50/17* (2023.02); *H10K 50/171* (2023.02)

(58) Field of Classification Search
CPC ...... H10K 50/17; H10K 50/171; H10K 59/40; H10K 59/1201; H10K 71/621; H10K 50/15; H10K 50/16; H10K 59/38; H10K 59/805; H10K 59/8791; H10K 2102/351; C09D 5/16; C09D 7/63; G02B 5/3033
See application file for complete search history.

(56) References Cited

U.S. PATENT DOCUMENTS

| | | | |
|---|---|---|---|
| 9,761,647 | B2 | 9/2017 | Lee et al. |
| 10,338,644 | B2 | 7/2019 | Jung et al. |
| 10,481,717 | B2 | 11/2019 | Miyamoto |
| 10,629,855 | B2 | 4/2020 | Kim et al. |
| 10,733,408 | B2 | 8/2020 | Bok |
| 11,232,275 | B2 | 1/2022 | Bok |
| 11,460,619 | B2 * | 10/2022 | Chen .................. G02B 5/3016 |
| 11,686,970 | B2 * | 6/2023 | Beon ................ G02F 1/133305 349/56 |
| 2011/0127498 | A1 * | 6/2011 | Jung .................... H10K 59/872 257/40 |
| 2012/0104422 | A1 | 5/2012 | Lee et al. |
| 2012/0280894 | A1 | 11/2012 | Park |
| 2013/0154910 | A1 * | 6/2013 | Chu ..................... H10K 59/353 345/83 |
| 2014/0220715 | A1 * | 8/2014 | Kang .................. H10K 71/166 118/504 |
| 2015/0009104 | A1 * | 1/2015 | Kim ..................... G09G 3/3225 345/76 |
| 2015/0028298 | A1 | 1/2015 | Chung et al. |
| 2015/0053933 | A1 * | 2/2015 | Lee ..................... H10K 85/654 257/40 |
| 2016/0133680 | A1 | 5/2016 | Lee et al. |
| 2016/0254336 | A1 * | 9/2016 | Zhang ................. G02F 1/13439 349/33 |
| 2017/0053972 | A1 * | 2/2017 | Kim ..................... H10K 59/352 |
| 2017/0068287 | A1 | 3/2017 | Jung et al. |
| 2017/0110532 | A1 * | 4/2017 | Kim ..................... H10K 59/124 |
| 2017/0133436 | A1 | 5/2017 | Wang et al. |
| 2017/0214003 | A1 | 7/2017 | Lee et al. |
| 2017/0237038 | A1 * | 8/2017 | Kim ..................... H10K 77/10 257/40 |
| 2017/0277219 | A1 * | 9/2017 | Chung .................. H04N 23/57 |
| 2017/0362698 | A1 * | 12/2017 | Kobayashi ............. C23C 16/44 |
| 2018/0033969 | A1 * | 2/2018 | Kamijo ................ G02F 1/1345 |
| 2018/0061904 | A1 * | 3/2018 | Shim ..................... H10K 59/30 |
| 2018/0089485 | A1 | 3/2018 | Bok |
| 2018/0090722 | A1 * | 3/2018 | Kim ..................... H10K 50/822 |
| 2018/0123074 | A1 * | 5/2018 | Lee ..................... H10K 59/40 |
| 2018/0159086 | A1 * | 6/2018 | Cho .................... H10K 59/8793 |
| 2018/0203555 | A1 | 7/2018 | Miyamoto |
| 2018/0301521 | A1 * | 10/2018 | Yang .................... H10K 59/35 |
| 2019/0074479 | A1 * | 3/2019 | Lee ..................... H10K 59/873 |
| 2019/0181345 | A1 | 6/2019 | Hwang et al. |
| 2019/0392767 | A1 * | 12/2019 | Kim ................... G02F 1/136286 |
| 2020/0006443 | A1 * | 1/2020 | Park ................. H10K 59/80518 |
| 2020/0006701 | A1 * | 1/2020 | Lee ..................... H10K 59/12 |
| 2020/0111856 | A1 * | 4/2020 | Lee ..................... G06F 3/0445 |
| 2020/0160775 | A1 * | 5/2020 | Zhang .................. H10K 59/128 |
| 2020/0176530 | A1 * | 6/2020 | Baek .................. H10K 59/352 |
| 2020/0176722 | A1 * | 6/2020 | Lu ...................... H10K 71/621 |
| 2020/0203453 | A1 * | 6/2020 | Kim .................... H10K 59/128 |
| 2020/0212140 | A1 * | 7/2020 | Huh .................... H10K 59/121 |
| 2020/0227493 | A1 * | 7/2020 | Kang .................. H10K 71/621 |
| 2020/0364434 | A1 | 11/2020 | Bok |
| 2021/0333458 | A1 * | 10/2021 | Huang ................. G02B 5/3058 |
| 2021/0335907 | A1 * | 10/2021 | Xie .................... H10K 59/351 |
| 2021/0357605 | A1 | 11/2021 | Bok |
| 2022/0091319 | A1 * | 3/2022 | Kishimoto .......... G06F 3/04162 |
| 2022/0140263 | A1 * | 5/2022 | Liu ...................... B32B 17/06 361/679.56 |
| 2022/0197082 | A1 * | 6/2022 | Hai ..................... G02B 1/11 |

FOREIGN PATENT DOCUMENTS

| | | |
|---|---|---|
| JP | 2007-188854 A | 7/2007 |
| JP | 2009-228076 A | 10/2009 |
| JP | 2012-234798 A | 11/2012 |
| JP | 2018-112690 A | 7/2018 |
| KR | 10-2015-0070544 A | 6/2015 |
| KR | 10-2017-0030314 A | 3/2017 |
| KR | 10-2018-0033361 A | 4/2018 |
| KR | 10-2018-0034746 A | 4/2018 |
| TW | 201246552 A | 11/2012 |
| WO | WO 2018/198052 A1 | 11/2018 |

OTHER PUBLICATIONS

European Patent Office, Extended European Search Report and Opinion, EP Patent Application No. 20210954.2, Apr. 29, 2021, nine pages.

Japan Patent Office, Office Action, JP Patent Application No. 2022-079921, Mar. 7, 2023, 11 pages.

Japan Patent Office, Office Action, JP Patent Application No. 2020-201031, Oct. 5, 2021, 12 pages.

Taiwan Intellectual Property Office, Office Action, TW Patent Application No. 109142401, Sep. 30, 2021, eight pages.

United States Office Action, U.S. Appl. No. 17/102,028, filed Oct. 21, 2022, 11 pages.

United States Office Action, U.S. Appl. No. 17/102,028, filed May 19, 2022, ten pages.

* cited by examiner

DISPLAY DEVICE HAVING DISPLAY AREA AND TRANSPARENT AREA

CROSS REFERENCE TO RELATED APPLICATIONS

The present application is a continuation application of U.S. application Ser. No. 18/140,865, filed on Apr. 28, 2023, which is a divisional application of U.S. application Ser. No. 17/102,028, filed on Nov. 23, 2020, which claims the priority benefit of Republic of Korea Patent Application No. 10-2019-0160708 filed in the Republic of Korea on Dec. 5, 2019, all of which are hereby incorporated by reference in its entirety.

BACKGROUND

Technical Field

The present disclosure relates to a display device, and more particularly, to a display device including a transparent area for an auxiliary equipment such as a camera or a fingerprint sensor and a method of fabricating the display device.

Discussion of the Related Art

A mobile terminal is a portable terminal capable of transmitting and receiving a voice, a character and an image data through a wireless communication. A flat panel display (FPD) such as an organic light emitting diode (OLED) display device may be used for the mobile terminal.

Recently, a mobile terminal including an auxiliary equipment such as a camera for shooting and a fingerprint sensor for certification has been suggested.

In the mobile terminal, the auxiliary equipment is disposed on a rear surface of a display panel, and the display panel includes a transparent area corresponding to the auxiliary equipment so that the auxiliary equipment can recognize a subject over a front surface of the display panel.

To reduce a bezel of a non-display area and extend a display area, the transparent area for the auxiliary equipment is disposed inside the display area. After the display panel is completed, a substrate, an array layer, a light emitting diode, an encapsulating layer and a polarizing layer of the transparent area are removed through a cutting process such as a laser trimming. As a result, a transmittance of the transparent area may increase.

However, a fabrication cost increases and a productivity decreases due to addition of the cutting process.

In addition, since the light emitting diode and the encapsulating layer on the substrate are removed through the cutting process, a side surface of the light emitting diode and the encapsulating layer is exposed to an exterior. As a result, an oxygen or a moisture of the exterior is injected through the side surface of the light emitting diode and the encapsulating layer and deterioration such as a particle is generated in the display panel.

To prevent the deterioration, the light emitting diode is separated by forming a groove in the array layer under the light emitting diode. However, the fabrication cost further increases and the productivity further decreases due to addition of a forming process of the groove.

SUMMARY

Accordingly, the present disclosure is directed to a display device and a method of fabricating the display device that substantially obviate one or more of the problems due to limitations and disadvantages of the related art.

An object of the present disclosure is to provide a display device including a transparent area and a method of fabricating the display device where a second electrode is selectively formed in a display area except the transparent area using a deposition preventing layer.

Another object of the present disclosure is to provide a display device including a transparent area and a method of fabricating the display device where a second electrode is selectively formed in a display area and a portion of the transparent area.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, a display device includes a substrate including a display area having a plurality of first color subpixels and a transparent area inside the display area, an array layer in the display area on the substrate; a first electrode in each of the plurality of first color subpixels on the array layer, a first emission assisting layer on the first electrode, an emitting material layer in each of the plurality of first color subpixels on the first emission assisting layer, a second emission assisting layer on the emitting material layer, a deposition preventing layer in the transparent area on the second emission assisting layer, a second electrode on the second emission assisting layer, the second electrode selectively disposed in a region where the deposition preventing layer is not disposed, an encapsulating layer on the deposition preventing layer and the second electrode, a polarizing layer in the display area on the encapsulating layer, and an auxiliary equipment in the transparent area under the substrate.

In another aspect, a method of fabricating a display device includes forming an array layer on a substrate including a display area having a plurality of first color subpixels and a transparent area inside the display area, the array layer disposed in the display area, forming a first electrode in each of the plurality of first color subpixels on the array layer, forming a first emission assisting layer on the first electrode, forming an emitting material layer in each of the plurality of first color subpixels on the first emission assisting layer, forming a second emission assisting layer on the emitting material layer, forming a deposition preventing layer in the transparent area on the second emission assisting layer, forming a second electrode on the second emission assisting layer, the second electrode selectively disposed in a region where the deposition preventing layer is not disposed, forming an encapsulating layer on the deposition preventing layer and the second electrode, forming a polarizing layer in the display area on the encapsulating layer, and forming an auxiliary equipment in the transparent area under the substrate.

It is to be understood that both the foregoing general description and the following detailed description are explanatory and are intended to provide further explanation of the disclosure as claimed.

BRIEF DESCRIPTION OF THE DRAWINGS

The accompanying drawings, which are included to provide a further understanding of the disclosure and are

DETAILED DESCRIPTION

Figure 1:
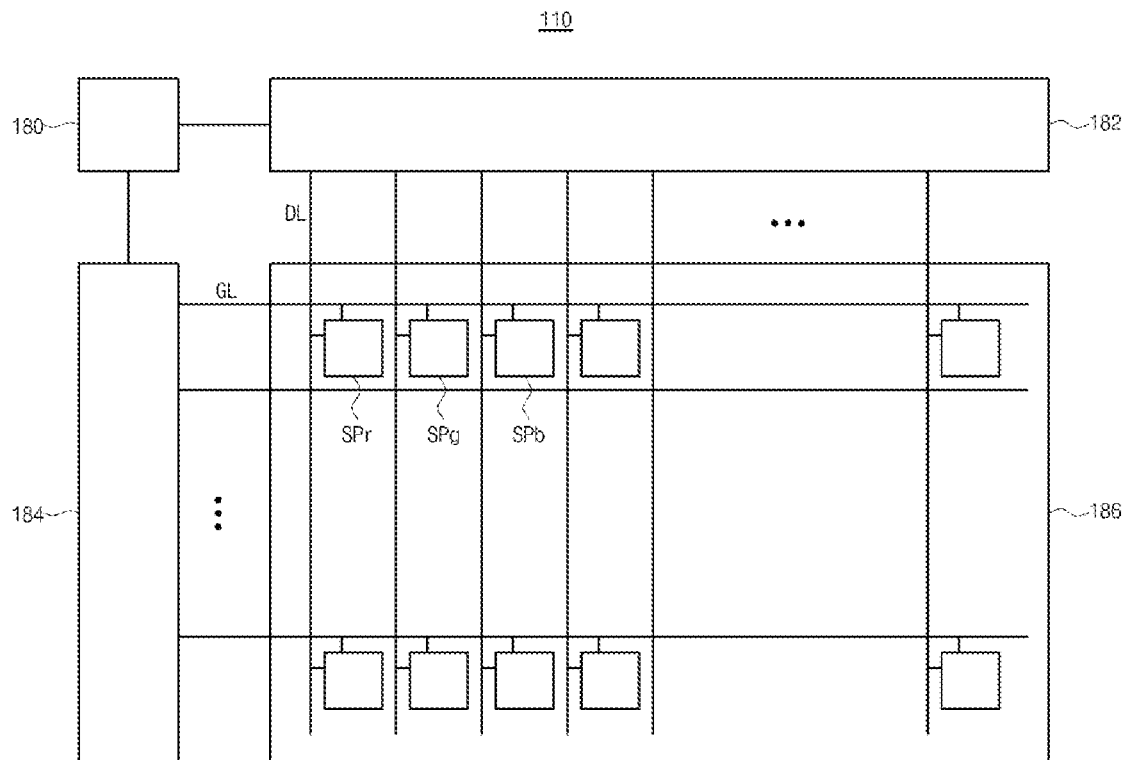
FIG. 1 is a view showing a display device according to a first embodiment of the present disclosure.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range.

In describing a position relationship, when a position relation between two parts is described as, for example, "on," "over," "under," or "next," one or more other parts may be disposed between the two parts unless a more limiting term, such as "just" or "direct(ly)," is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Hereinafter, a display device and a method of fabricating the display device according to embodiments of the present disclosure will be described in detail with reference to the accompanying drawings. In the following description, like reference numerals designate like elements throughout. When a detailed description of well-known functions or configurations related to this document is determined to unnecessarily cloud a gist of the inventive concept, the detailed description thereof will be omitted or will be made brief.

Figure 2:
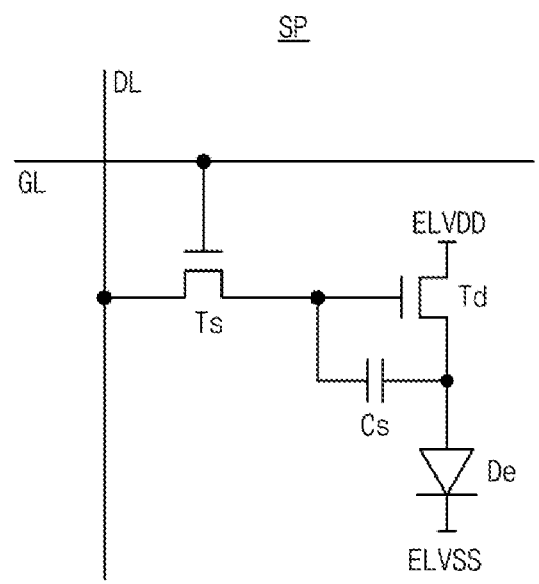
FIG. 2 is a view showing a subpixel of a display device according to a first embodiment of the present disclosure.

FIG. 1 is a view showing a display device according to a first embodiment of the present disclosure, and FIG. 2 is a view showing a subpixel of a display device according to a first embodiment of the present disclosure. An organic light emitting diode(OLED) display device is exemplarily illustrated as a display device in FIGS. 1 and 2.

In FIG. 1, a display device 110 includes a timing controlling part 180, a data driving part 182, a gate driving part 184, and a display panel 186.

The timing controlling part 180 generates a gate control signal, a data control signal and an image data using an image signal and a plurality of timing signals transmitted from an external system such as a graphic card or a television system. The timing controlling part 180 supplies the data control signal and the image data to the data driving part 182 and supplies the gate control signal to the gate driving part 184.

The data driving part 182 generates a data signal (a data voltage) using the data control signal and the image data transmitted from the timing controlling part 180 and supplies the data voltage to a data line DL of the display panel 186.

The gate driving part 184 generates a gate signal (a gate voltage) using the gate control signal transmitted from the timing controlling part 180 and supplies the gate voltage to a gate line GL of the display panel 186.

The display panel 186 displays an image using the gate signal and the data signal. The display panel 186 includes the gate line GL, the data line DL and a plurality of subpixels SP (of FIG. 2) connected to the gate line GL and the data line DL.

For example, each of the plurality of subpixels SP may be defined by the gate line GL and the data line DL crossing each other, and the plurality of subpixels SP may include red, green and blue subpixels SPr, SPg and SPb corresponding to red, green and blue colors, respectively.

Each of the plurality of subpixels SP includes a plurality of thin film transistors (TFTs). For example, each of the plurality of subpixels SP may include a switching TFT, a driving TFT, a storage capacitor and a light emitting diode.

In FIG. 2, each of the plurality of subpixels SP of the OLED display device 110 according to a first embodiment of the present disclosure includes a switching TFT Ts, a driving TFT Td, a storage capacitor Cs and a light emitting diode De.

The switching TFT Ts supplies the data signal of the data line DL to the driving TFT Td according to the gate signal of the gate line GL, and the driving TFT Td supplies a high level voltage ELVDD to the light emitting diode De according to the data signal applied to a gate electrode through the switching TFT Ts.

The light emitting diode De displays various gray levels using various currents according to voltage differences between a voltage corresponding to the data signal and a low level voltage ELVSS.

Figure 3:
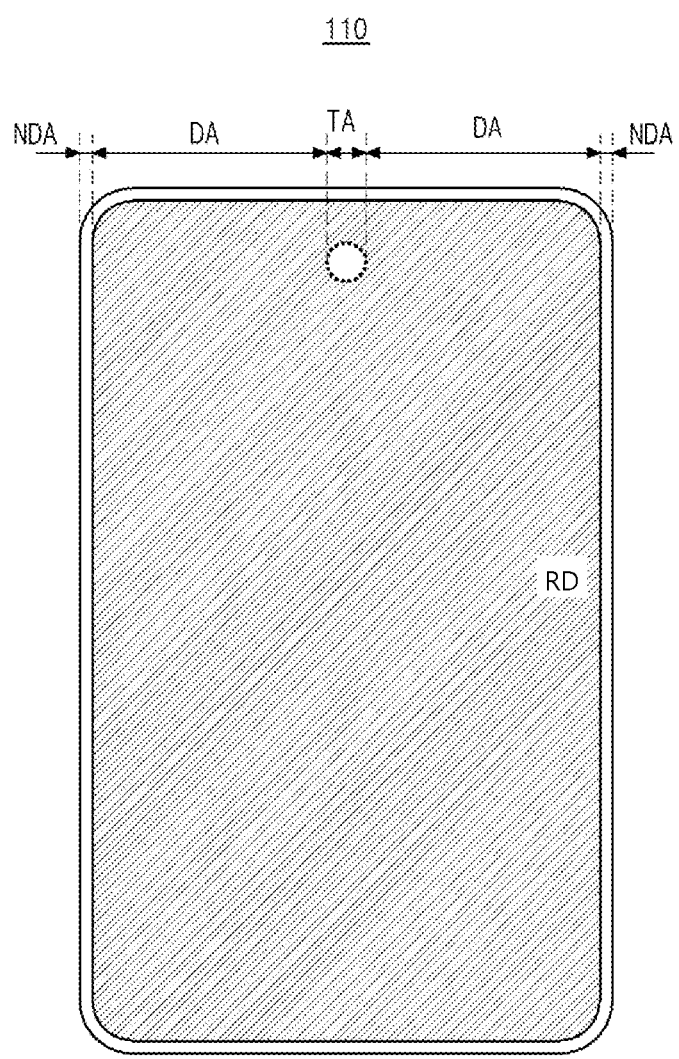
FIG. 3 is a plan view showing a display device according to a first embodiment of the present disclosure.
Figure 4:
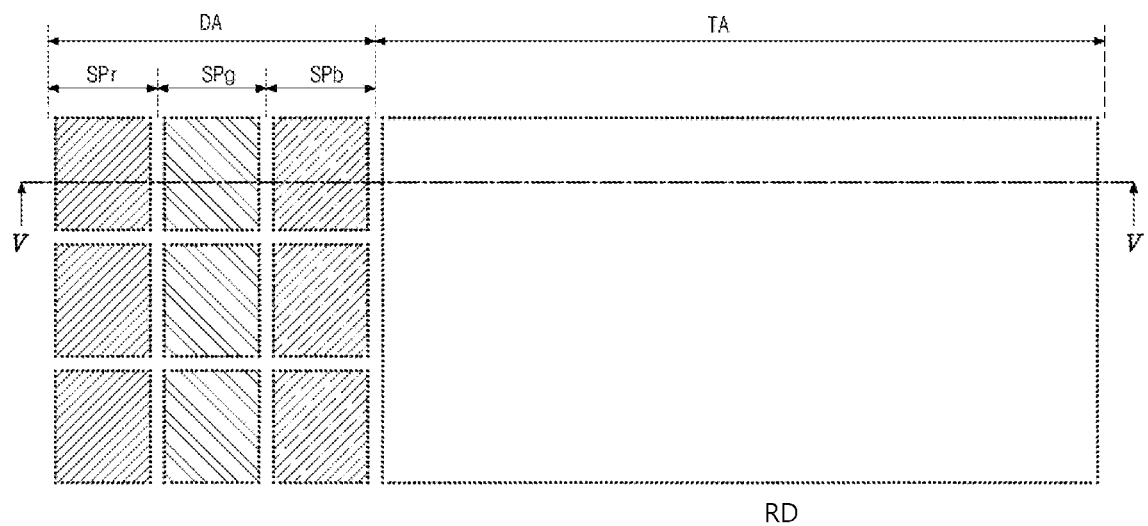
FIG. 4 is a magnified plan view showing a border region of a display area and a transparent area of FIG. 3 according to an embodiment of the present disclosure.
Figure 5:
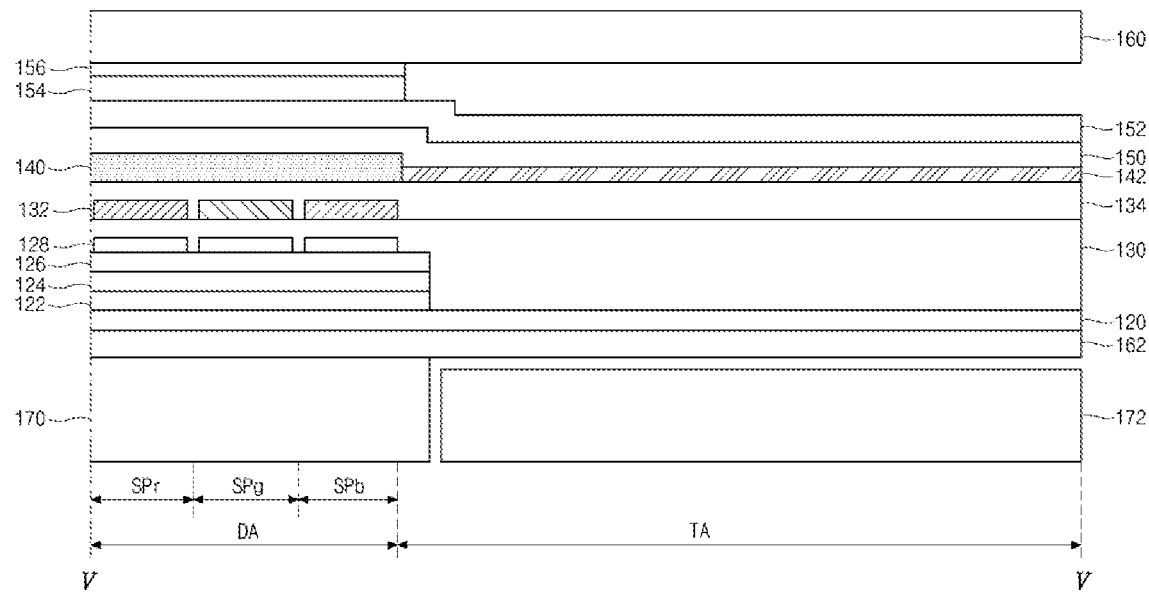
FIG. 5 is a cross-sectional view taken along a line V-V of FIG. 4 according to an embodiment of the present disclosure.

FIG. 3 is a plan view showing a display device according to a first embodiment of the present disclosure, FIG. 4 is a magnified plan view showing a border region of a display area and a transparent area of FIG. 3 according to an embodiment of the present disclosure, and FIG. 5 is a cross-sectional view taken along a line V-V of FIG. 4 according to an embodiment of the present disclosure. An organic light emitting diode (OLED) display device of an on-cell touch type and a top emission type is exemplarily illustrated as a display device.

In FIGS. 3, 4, and 5, a display device 110 according to a first embodiment of the present disclosure includes a display area DA used for displaying an image and sensing a touch, a transparent area TA inside the display area DA and a non-display area NDA surrounding the display area DA.

The display device 110 includes a display panel 186, a system part 170 and an auxiliary equipment 172. The display panel 186 may transmit an information to a user through an image displaying and may receive an information from the user through a touch sensing. The system part 170 may transmit and receive a signal and a power with the display panel and the auxiliary equipment 172. The auxiliary equipment 172 may receive an information such as a shape of a subject through the display panel 186.

A back plate 162 supports and protects a substrate 120. The back plate 162 may include a plastic such as polyethylene terephthalate (PET) and may have a refractive index of about 1.6.

The substrate 120 is disposed on a whole of the back plate 162, and a gate insulating layer 122, an interlayer insulating layer 124, and a passivation layer 126 are sequentially disposed in the display area DA on the substrate 120.

The substrate 120 includes the display area DA and the transparent area TA. The display area DA includes a plurality of first color subpixels such as red, green and blue subpixels SPr, SPg, and SPb, and the transparent area TA is disposed inside the display area DA.

The substrate 120 may include a glass or a plastic such as polyethylene terephthalate (PET) and may have a refractive index of about 1.6.

A plurality of thin film transistors (TFTs) such as a switching TFT Ts (of FIG. 2) and a driving TFT Td (of FIG. 2) and a storage capacitor Cs (of FIG. 2) may be disposed among the gate insulating layer 122, the interlayer insulating layer 124, and the passivation layer 126 of each of the red, green and blue subpixels SPr, SPg, and SPb.

For example, the gate insulating layer 122 may be disposed between a gate electrode and a semiconductor layer of the switching TFT Ts and the driving TFT Td, the interlayer insulating layer 124 may be disposed between the gate electrode and a source electrode and between the gate electrode and a drain electrode of the switching TFT Ts and the driving TFT Td, and the passivation layer 126 may be disposed on the source electrode and the drain electrode of the switching TFT Ts and the driving TFT Td.

A first electrode 128 is disposed in each of the red, green and blue subpixels SPr, SPg, and SPb on the passivation layer 126, and a first emission assisting layer 130 is disposed on at least a part or a whole of the substrate 120 having the first electrode 128.

The first electrode 128 may include a first layer of a metallic material having a relatively high reflectance and a second layer of a transparent conductive material having a relatively high work function.

For example, the first electrode 128 may be an anode supplying a hole to an emitting material layer 132 and may be connected to the driving TFT Td.

The first emission assisting layer 130 may include a hole injecting layer injecting a hole into the emitting material layer 132 and a hole transporting layer transporting a hole to the emitting material layer 132. The hole injecting layer and the hole transporting layer may be sequentially disposed on the first electrode 128.

The emitting material layer 132 is disposed in each of the red, green, and blue subpixels SPr, SPg, and SPb on the first emission assisting layer 130, and a second emission assisting layer 134 is disposed on at least a part or a whole of the substrate 120 having the emitting material layer 132.

The emitting material layer 132 combines a hole supplied from the first electrode 128 and an electron supplied from a second electrode 140 to emit a light.

Although the emitting material layers 132 of the red, green, and blue subpixels SPr, SPg, and SPb exemplarily include different materials to emit red, green, and blue colored lights, respectively, in the first embodiment, the emitting material layers 132 of the red, green, and blue subpixels SPr, SPg, and SPb may have the same structure of the same material to emit a white colored light and a color filter layer may be disposed on the second electrode 140 in another embodiment.

The second emission assisting layer 134 may include an electron transporting layer transporting an electron to the emitting material layer 132 and an electron injecting layer injecting an electron. The electron transporting layer and the electron injecting layer may be sequentially disposed on the emitting material layer 132.

For example, the electron injecting layer may have a thickness of about 10 Å to about 40 Å.

Each of the first and second emission assisting layer 130 and 134 may have a refractive index of about 1.8.

Although the first and second emission assisting layers 130 and 134 of the same material are exemplarily disposed on a whole of the substrate 120 in the first embodiment, the first and second emission assisting layers 130 and 134 may be selectively disposed in the red, green, and blue subpixels SPr, SPg, and SPb with different materials.

The second electrode 140 and a deposition preventing layer 142 are disposed in the display area DA and the transparent area TA, respectively, on the second emission assisting layer 134.

The second electrode 140 is selectively disposed in a region where the deposition preventing layer 142 is not formed. As a result, and the second electrode 140 and the deposition preventing layer 142 may be exclusively disposed to each other.

The second electrode 140 may include a metallic material having a half transmittance and a relatively low work function.

For example, the second electrode 140 may be a cathode supplying an electron to the emitting material layer 132. The second electrode 140 may have a thickness of about 100 Å to about 200 Å and may include magnesium silver (MgAg).

The first electrode 128, the first emission assisting layer 130, the emitting material layer 132, the second emission assisting layer 134 and the second electrode 140 constitute a light emitting diode.

The deposition preventing layer 142 may include an organic material having a relatively low surface energy such that a metallic material is not adsorbed on and is detached from the deposition preventing layer 142 while the second electrode 140 is formed.

For example, the deposition preventing layer 142 may have a thickness of about 20 Å to about 300 Å.

The deposition preventing layer 142 will be illustrated later.

An encapsulating layer 150 is disposed on a whole of the substrate 120 having the second electrode 140 and the deposition preventing layer 142, and a touch layer 152 is disposed on a whole of the substrate 120 having the encapsulating layer 150.

The encapsulating layer 150 prevents penetration of an oxygen or a moisture of an exterior. The encapsulating layer 150 may include a plurality of organic material layers and a plurality of inorganic material layers and may have a refractive index of about 1.8.

The touch layer 152 senses a touch. The touch layer 152 may include a plurality of touch electrodes and an insulating layer, and the insulating layer may have a refractive index of about 1.5.

Although the touch layer 152 is exemplarily disposed on the encapsulating layer 150 in the first embodiment, the touch layer 152 may be disposed inside an array layer including the gate insulating layer 122, the interlayer insulating layer 124 and the passivation layer 126 or may be omitted in another embodiment.

A polarizing layer 154 is disposed in the display area DA on the touch layer 152, and an adhesive layer 156 is disposed in the display area DA on the polarizing layer 154.

The polarizing layer 154 minimizes or reduces re-emission of an external light by reflection on the array layer and the light emitting diode. The polarizing layer 154 may include a quarter wave plate and a linear polarizing layer sequentially on the touch layer 152.

A cover glass 160 is disposed on a whole of the substrate 120 having the adhesive layer 156. The cover glass 160 protects the touch layer 152, the light emitting diode and the plurality of TFTs.

The back plate 162, the substrate 120, the plurality of TFTs, the light emitting diode and the cover glass 160 constitute the display panel.

The system part 170 and the auxiliary equipment 172 are disposed in the display area DA and the transparent area TA, respectively, under the back plate 162.

In the display device 110 according to a first embodiment of the present disclosure, a cutting process of removing the light emitting diode and the encapsulating layer 150 of the transparent area TA is not performed. Instead, since the second electrode 140 of the light emitting diode is selectively formed in the display area DA using the deposition preventing layer 142, a side surface of the light emitting diode and the encapsulating layer 150 is not exposed to an exterior. As a result, penetration of an external oxygen or an external moisture is reduced or minimized and deterioration such as a particle is reduced or minimized.

In addition, since a cutting process such as a laser trimming and a process of forming a groove are omitted, a fabrication process is simplified, a fabrication cost is reduced, and a productivity is improved.

A method of fabricating the display device 110 is illustrated hereinafter.

Figure 6A:
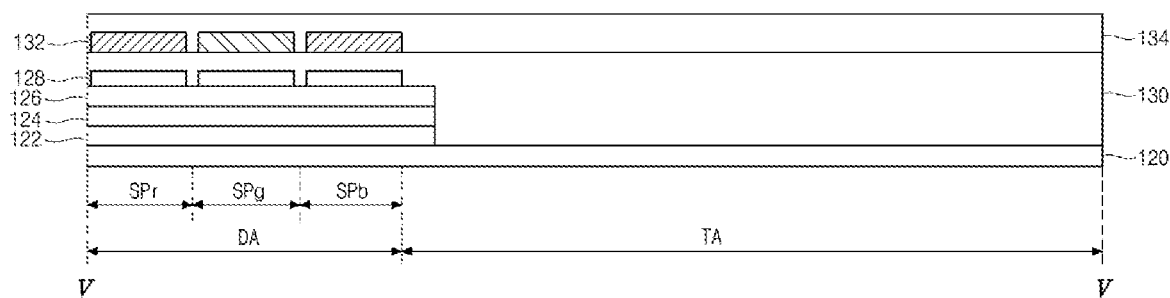
FIGS. 6A to 6E are cross-sectional views showing a method of fabricating a display device according to a first embodiment of the present disclosure.
Figure 6B:
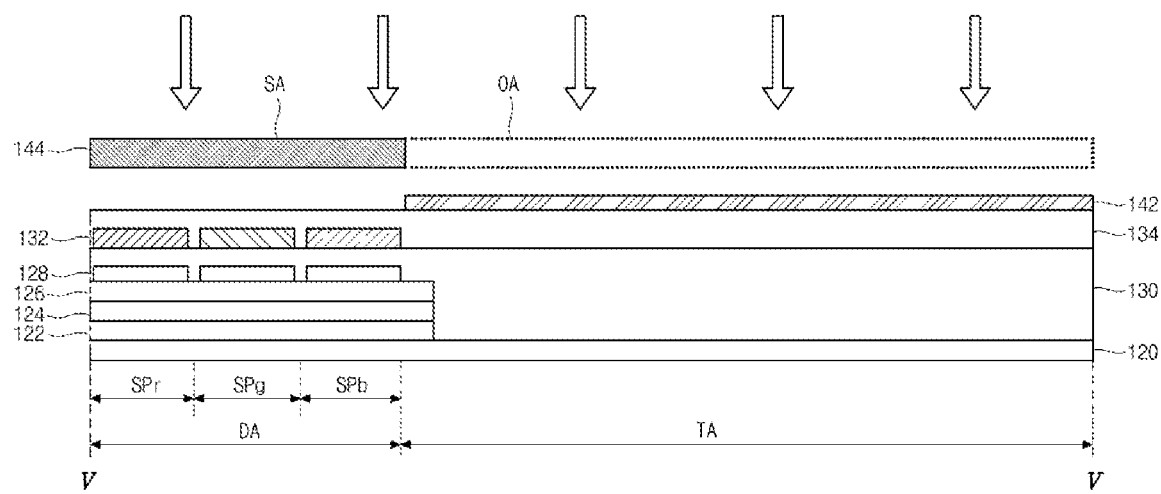
Figure 6C:
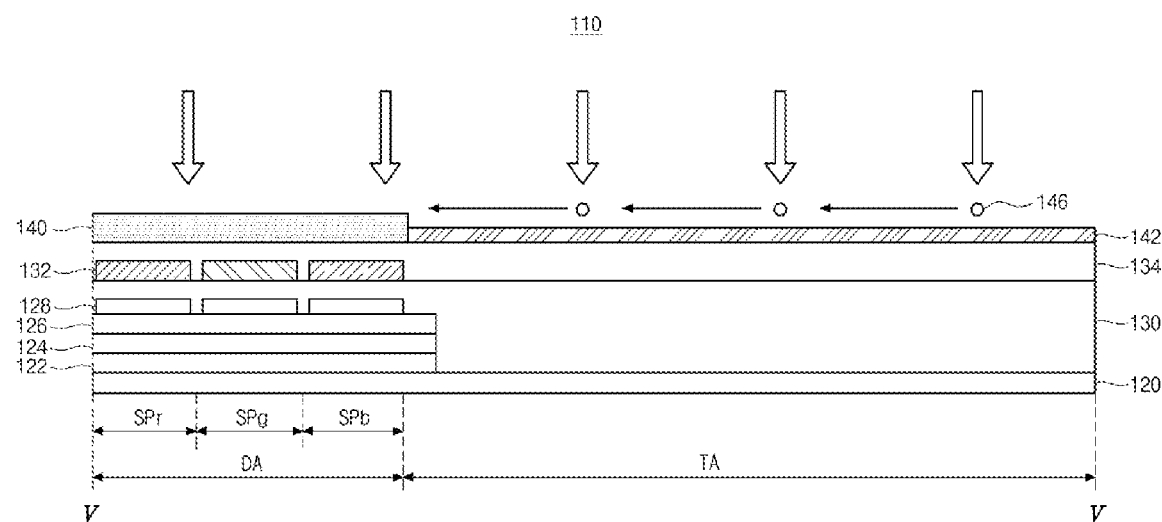
Figure 6D:
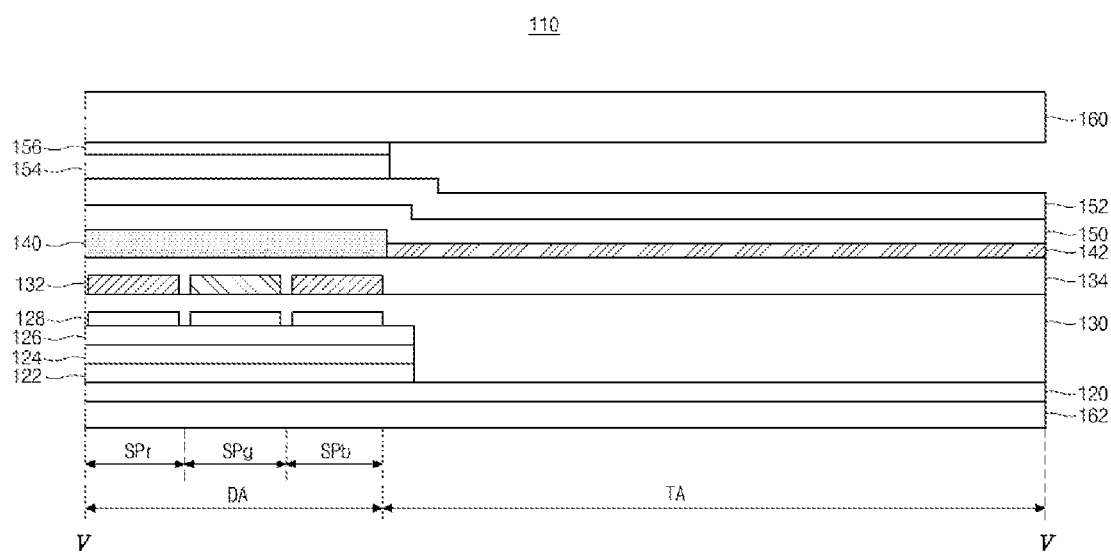
Figure 6E:
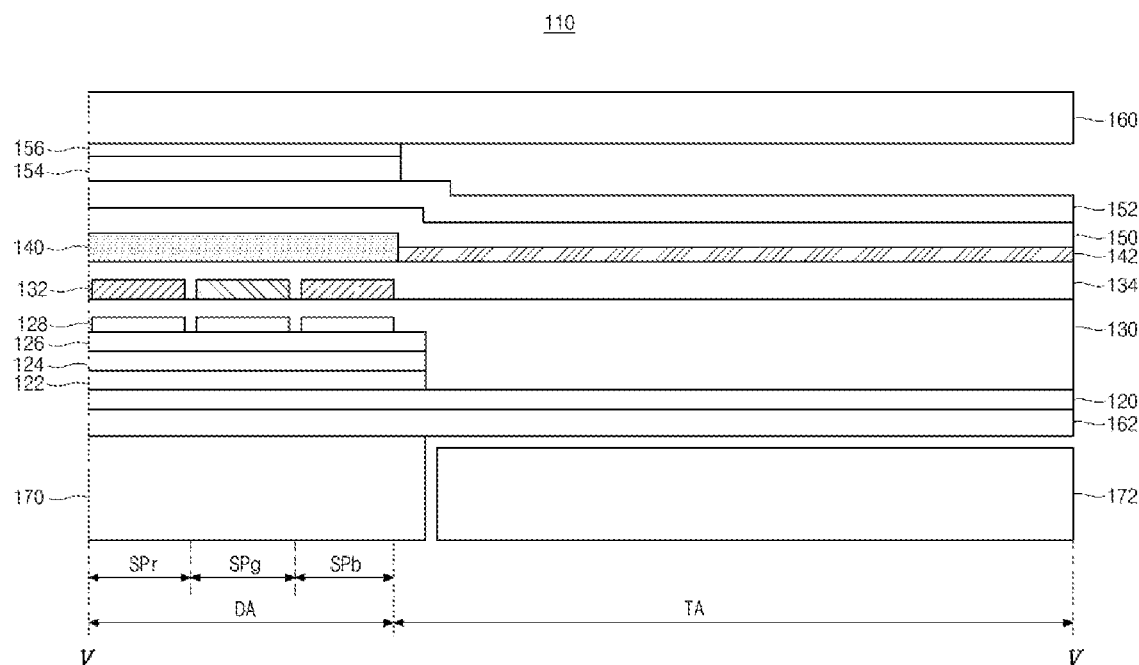
Figure 7:
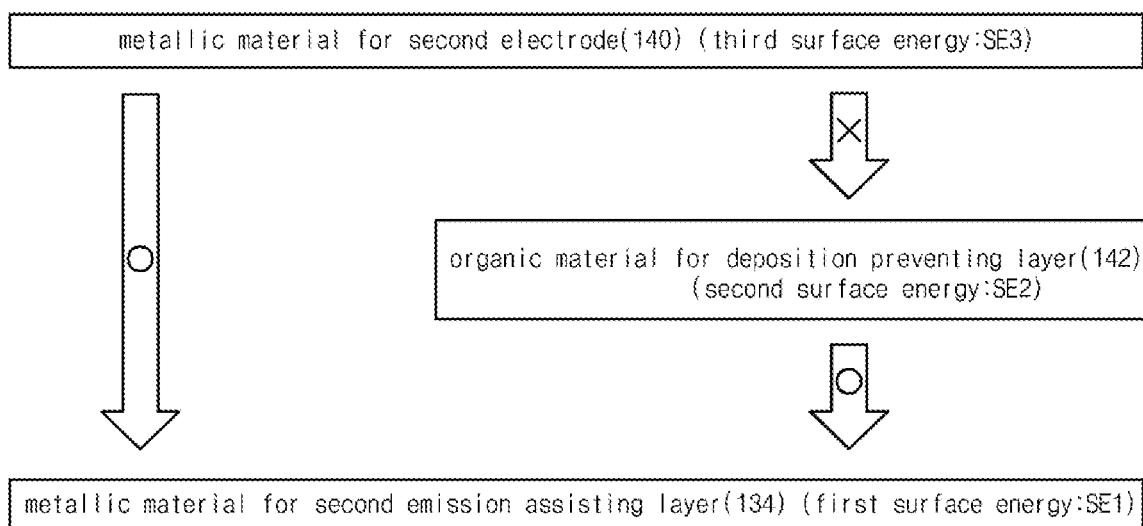
FIG. 7 is a view showing an adsorption and a desorption of a plurality of materials with respect to a surface energy of a display device according to a first embodiment of the present disclosure.
Figure 8:
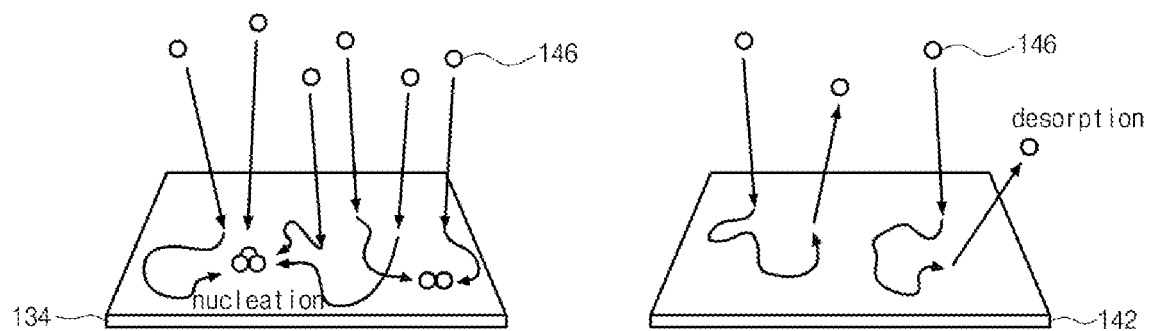
FIG. 8 is a behavior of a plurality of materials of a display device according to a first embodiment of the present disclosure.

FIGS. 6A to 6E are cross-sectional views showing a method of fabricating a display device according to a first embodiment of the present disclosure, FIG. 7 is a view showing an adsorption and a desorption of a plurality of materials with respect to a surface energy of a display device according to a first embodiment of the present disclosure, and FIG. 8 is a behavior of a plurality of materials of a display device according to a first embodiment of the present disclosure.

In FIG. 6A, a plurality of thin film transistors (TFTs) such as a switching TFT Ts (of FIG. 2) and a driving TFT Td (of FIG. 2) and a storage capacitor Cs (of FIG. 2) may be disposed among a gate insulating layer 122, an interlayer insulating layer 124 and a passivation layer 126.

The plurality of TFTs and a first electrode 124 may be formed through a photolithographic process.

Next, a first emission assisting layer 130 is formed on a whole of the substrate 120 having the first electrode 124, an emitting material layer 132 is formed in each of red, green, and blue subpixels SPr, SPg, and SPb on the first emission assisting layer 130, and a second emission assisting layer 134 is formed on a whole of the substrate 120 having the emitting material layer 132.

The first emission assisting layer 130, the emitting material layer 132 and the second emission assisting layer 134 may be formed through a thermal evaporation process using a shadow mask such as a fine metal mask.

An electron injecting layer of the second emission assisting layer 134 may be formed as a top surface of the substrate 120.

A metallic material for the electron injecting layer may have a relatively high surface energy. For example, the metallic material for the electron injecting layer may have a surface energy equal to or greater than about $0.5 \text{ J/m}^2$.

The metallic material for the electron injecting layer may have a relatively low melting point to be deposited at a relatively low temperature. For example, the metallic material for the electron injecting layer may have a melting point equal to or lower than about 1000° C.

The metallic material for the electron injecting layer may have a relatively great electric conductivity. For example, the metallic material for the electron injecting layer may have an electric conductivity equal to or greater than about $4.0*10^6 \text{ }\Omega^{-1}\text{m}^{-1}$.

The metallic material for the electron injecting layer may have a relatively low work function. For example, the metallic material for the electron injecting layer may have a work function of about 2.4 eV to about 2.8 eV.

The electron injecting layer may have a thickness of about 10 Å to about 40 Å and may be formed with a deposition rate equal to or greater than about 0.05 Å/sec.

In FIG. 6B, a shadow mask 144 having a shielding area SA and an opening area OA is disposed over the second emission assisting layer 134, and an organic material is deposited on the second emission assisting layer 134 through the opening area OA.

As a result, a deposition preventing layer 142 is formed in a transparent area TA on the second emission assisting layer 134, and the second emission assisting layer 134 of the display area DA is exposed.

The shadow mask 144 may be aligned such that the shielding area SA and the opening area OA correspond to the display area DA and the transparent area TA, respectively.

An organic material for the deposition preventing layer 142 may have a relatively small surface energy and a relatively low glass transition temperature Tg. For example, the organic material for the deposition preventing layer 142 may have a surface energy equal to or smaller than about 0.2 J/m² and a glass transition temperature equal to or lower than about 40° C.

The organic material for the deposition preventing layer 142 may have a relatively great refractive index and a relatively small light absorption rate. For example, the organic material for the deposition preventing layer 142 may have a refractive index equal to or greater than about 1.7 with respect to a light of a wavelength of about 550 nm and a light absorption rate equal to or smaller than about 0.02.

The organic material for the deposition preventing layer 142 may be patterned using a shadow mask 144. For example, the organic material for the deposition preventing layer 142 may be patterned through the shadow mask 144 to form a pattern corresponding to a pixel of a resolution of about 300 ppi.

The organic material for the deposition preventing layer 142 may have a relatively great high temperature storage reliability. For example, the organic material for the deposition preventing layer 142 may be determined such that deterioration does not occur even when the deposition preventing layer 142 of a thickness of about 300 Å is left at a temperature of about 100° C. for about 500 hours.

The deposition preventing layer 142 may have a thickness of about 20 Å to about 300 Å.

The organic material for the deposition preventing layer 142 may be different from an organic insulating material such as photo acryl and polyimide used for the gate insulating layer 122, the interlayer insulating layer 124 and the passivation layer 126 and an inorganic insulating material such as silicon nitride (SiNx), silicon oxide (SiO₂) and silicon oxynitride (SiON).

While the organic insulating material for the gate insulating layer 122, the interlayer insulating layer 124 and the passivation layer 126 and the inorganic insulating material may be patterned through a photolithographic process, the organic material for the deposition preventing layer 142 may not be patterned through a photolithographic process and may be patterned through a thermal deposition process using a shadow mask.

For example, the organic material for the deposition preventing layer 142 may include open-ring isomer diarylethene (DAE) expressed by a following CHEMICAL FORMULA 1.

[CHEMICAL FORMULA 1]

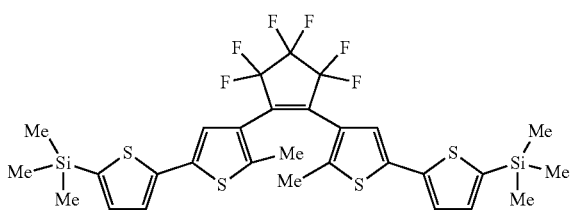

In FIG. 6C, a metallic material is deposited on the second emission assisting layer 134 of the display area DA and the deposition preventing layer 142 of the transparent area TA.

An atom 146 of the metallic material is not adsorbed onto and is desorbed from the deposition preventing layer 142 of the transparent area TA. The atom 146 of the metallic material is selectively adsorbed onto the second emission assisting layer 134 of the display area DA such that a second electrode 140 is selectively formed in the display area DA.

The metallic material for the second electrode 140 may have a relatively great surface energy. For example, the metallic material for the second electrode 140 may have a surface energy equal to or greater than about 0.5 J/m².

Specifically, a surface energy of the metallic material for the second electrode 140 may be greater than a surface energy of the metallic material for the electron injecting layer of the second emission assisting layer 134.

The metallic material for the second electrode 140 may have a relatively low melting point to be deposited at a relatively low temperature. For example, the metallic material for the second electrode 140 may have a melting point equal to or lower than about 1000° C.

The metallic material for the second electrode 140 may have a relatively great electric conductivity. For example, the metallic material for the second electrode 140 may have an electric conductivity equal to or greater than about $1.0*10^7 \, \Omega^{-1} m^{-1}$.

The metallic material for the second electrode 140 may have a relatively small refractive index and a relatively small light absorption rate. For example, the metallic material for the second electrode 140 may have a refractive index of about 1.0 with respect to a light of a wavelength of about 550 nm and a light absorption rate equal to or smaller than about 5.5.

The metallic material for the second electrode 140 may have a thickness of about 100 Å to about 200 Å and may be formed with a deposition rate of about 0.1 Å/sec to about 100 Å/sec.

In FIGS. 7 and 8, the metallic material for the second emission assisting layer 134, the organic material for the deposition preventing layer 142, and the metallic material for the second electrode 140 have first, second, and third surface energies SE1, SE2, and SE3, respectively. The first surface energy SE1 is greater than the second surface energy SE2 and is smaller than the third surface energy SE3. (SE2<SE1<SE3)

Since the deposition preventing layer 142 is formed of an organic material having the second surface energy SE2 of a relatively small value and a relatively low glass transition temperature, the deposition preventing layer 142 has an active surface atomic movement.

As a result, the atom 146 of the metallic material for the second electrode 140 having the third surface energy SE3 is not adsorbed on and is detached from a surface of the deposition preventing layer 142 having the second surface energy SE2 of a relatively small value and a relatively low glass transition temperature in the transparent area TA and then moves to the display area DA.

The atom 146 of the metallic material for the second electrode 140 having the third surface energy SE3 is selectively adsorbed on a surface of the electron injecting layer of the second emission assisting layer 134 having the first surface energy SE1 of a relatively great value in the display area DA. In the display area DA, a nucleation of the atom 146 of the metallic material is performed and the atom 146 of the metallic material is gradually accumulated using a nucleus as a seed. As a result, the second electrode 140 is selectively formed in the display area DA.

Although the second electrode 140 is selectively formed in the display area DA by adjusting the surface energies of the metallic material for the electron injecting layer of the second emission assisting layer 134, the organic material for the deposition preventing layer 142 and the metallic material for the second electrode 140 in the first embodiment, the second electrode 140 may be selectively formed in the display area DA by adjusting deposition temperatures and deposition rates of the metallic material for the electron injecting layer of the second emission assisting layer 134, the organic material for the deposition preventing layer 142 and the metallic material for the second electrode 140 in another embodiment.

In FIG. 6D, an encapsulating layer 150 is formed on a whole of the substrate 120 having the second electrode 140 and the deposition preventing layer 142, and a touch layer 152 is formed on a whole of the substrate 120 having the encapsulating layer 150.

Next, a polarizing layer 154 is formed in the display area DA on the encapsulating layer 150. For example, the polarizing layer 154 having a film type of a size corresponding to the display area DA may be attached to the encapsulating layer 150 of the display area DA.

Next, an adhesive layer 156 is formed in the display area DA on the polarizing layer 154, and a cover glass 160 is formed on a whole of the substrate having the adhesive layer 156.

For example, the cover glass 160 may be attached to the polarizing layer 154 using the adhesive layer 156.

Next, a back plate 162 is formed on a whole of a rear surface of the substrate 120.

For example, the substrate 120 having the cover glass 160 may be attached to the back plate 162 using an adhesive layer.

In FIG. 6E, a system part 170 and an auxiliary equipment 172 are disposed in the display area DA and the transparent area TA, respectively, on the rear surface of the substrate 120.

In the method of fabricating the display device 110 according to a first embodiment of the present disclosure, a cutting process of removing the light emitting diode and the encapsulating layer 150 of the transparent area TA is not performed. Instead, since the metallic material for the second electrode 140 is not adsorbed on the deposition preventing layer 142 of the transparent area TA and is adsorbed on the second emission assisting layer 134 of the display area DA, the second electrode 140 of the light emitting diode is selectively formed in the display area DA such that a side surface of the light emitting diode and the encapsulating layer 150 is not exposed to an exterior. As a result, penetration of an external oxygen or an external moisture is minimized and deterioration such as a particle is minimized.

In addition, since a cutting process such as a laser trimming and a process of forming a groove are omitted, a fabrication process is simplified, a fabrication cost is reduced, and a productivity is improved.

Figure 9:
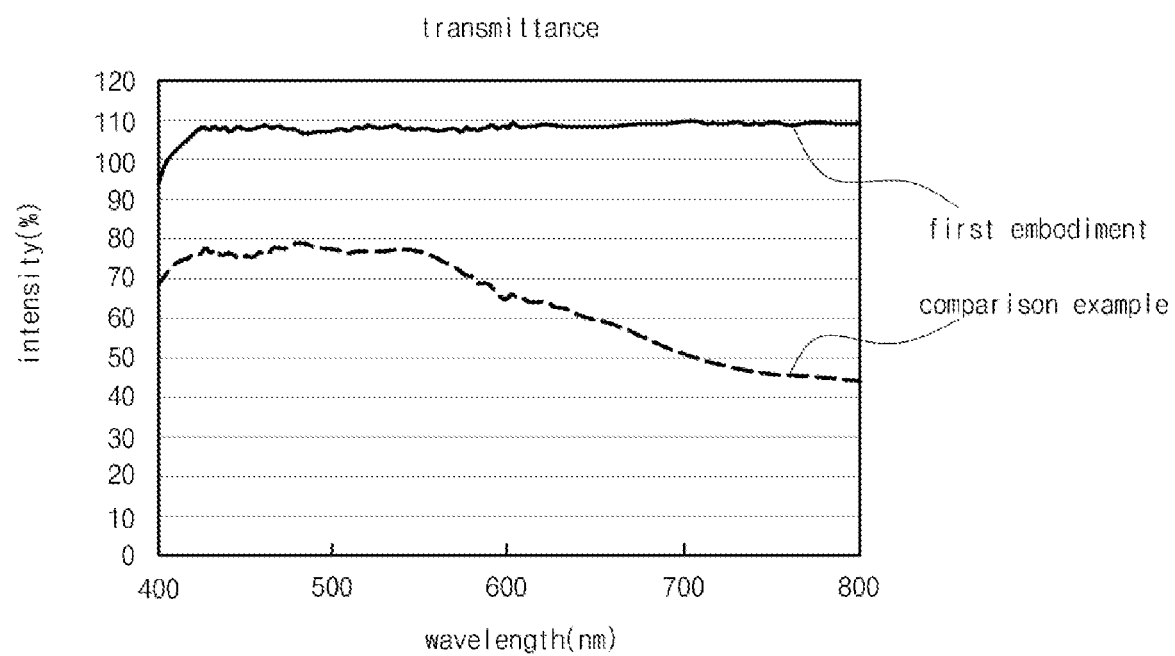
FIG. 9 is a graph showing a transmittance of a display device according to a first embodiment of the present disclosure.

FIG. 9 is a graph showing a transmittance of a display device according to a first embodiment of the present disclosure. FIG. 9 shows a transmittance of a display device where a cover glass 160 is omitted.

In the display device 110 according to a first embodiment of FIG. 9, the second electrode 140 is formed in the display area DA and is not formed in the transparent area TA due to the deposition preventing layer 142.

In a display device according to a comparison example, a second electrode 140 having a half transmissive property is formed in a display area DA and a transparent area TA without a deposition preventing layer.

The second electrode 140 includes magnesium silver (MgAg) and has a thickness of about 140 Å.

A transmittance of the transparent area TA of the display device 110 of the first embodiment is greater than a transmittance of the transparent area TA of the display device of the comparison example with respect to a light of a wavelength of about 400 nm to about 800 nm.

The transparent area TA of the display device 110 of the first embodiment has intensities of about 107.6%, about 107.2% and about 108.0% with respect to a light of wavelengths of about 430 nm, about 550 nm, and about 620 nm, respectively. The transparent area TA of the display device of the comparison example has intensities of about 75.7%, about 75.8%, and about 63.2% with respect to a light of wavelengths of about 430 nm, about 550 nm, and about 620 nm, respectively.

As a result, the transparent area TA of the display device 110 of the first embodiment has a greater transmittance by about 30% or more as compared with the transparent area TA of the display device of the comparison example, and a luminance of the display device 110 is improved.

In addition, since the transparent area TA of the display device 110 of the first embodiment has a uniform transmittance of a relatively high value, deterioration such as a color shift is reduced and minimized.

The transparent area TA of the display device 110 of the first embodiment having the cover glass 160 may have intensities of about 97.6%, about 97.2%, and about 98.0% with respect to a light of wavelengths of about 430 nm, about 550 nm, and about 620 nm, respectively. The transparent area TA of the display device of the comparison example having the cover glass 160 has intensities of about 76.7%, about 65.8%, and about 53.2% with respect to a light of wavelengths of about 430 nm, about 550 nm, and about 620 nm, respectively.

In the display device 110 according to a first embodiment of the present disclosure, a cutting process of removing the light emitting diode and the encapsulating layer 150 of the transparent area TA is not performed. Instead, since the metallic material for the second electrode 140 is not adsorbed on the deposition preventing layer 142 of the transparent area TA and is adsorbed on the second emission assisting layer 134 of the display area DA, the second electrode 140 of the light emitting diode is selectively formed in the display area DA such that a side surface of the light emitting diode and the encapsulating layer 150 is not exposed to an exterior.

As a result, penetration of an external oxygen or an external moisture is reduced or minimized and deterioration such as a particle is reduced or minimized.

For example, in the display device of the comparison example where the light emitting diode and the encapsulating layer 150 of the transparent area TA are removed through a cutting process such as a laser trimming, deterioration of a moisture penetration occurs from a storage reliability test of a temperature of about 85° C. and a humidity of about 85% for 200 hours. In the display device 110 of the first embodiment where the second electrode 140 is selectively formed in the display area DA using the deposition preventing layer 142, deterioration of a moisture penetration does not occur from a storage reliability test of a temperature of about 85° C. and a humidity of about 85% for 408 hours.

In addition, since a cutting process such as a laser trimming and a process of forming a groove are omitted, a fabrication process is simplified, a fabrication cost is reduced, and a productivity is improved.

Further, since the transparent area TA has a uniform transmittance of a relatively high value, a luminance is improved and deterioration such as a color shift is reduced or minimized.

In another embodiment, a display quality of an image is improved by disposing color subpixels such as red, green, and blue subpixels SPr, SPg, and SPb in a portion of the transparent arca TA.

Figure 10:
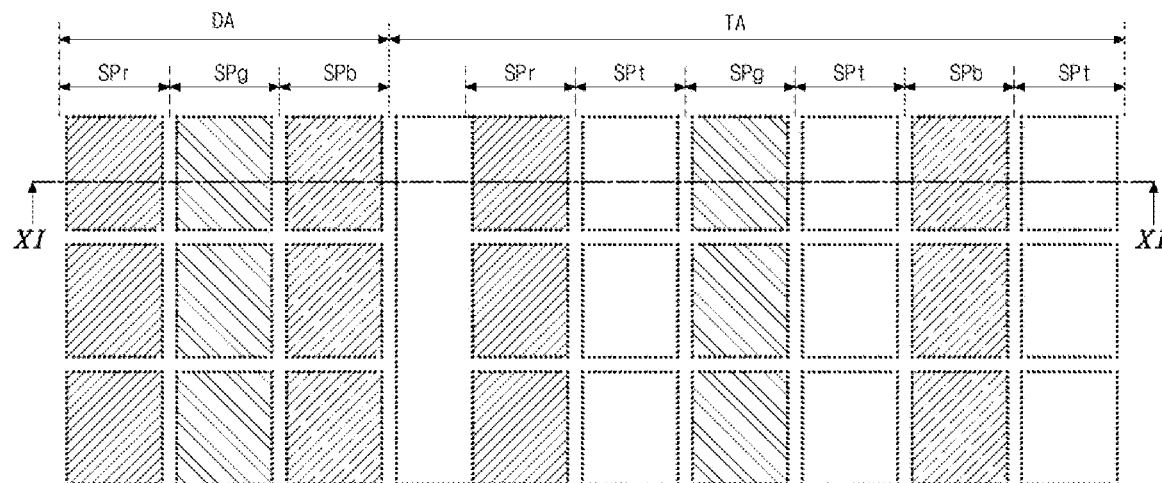
FIG. 10 is a magnified plan view showing a border region of a display area and a transparent area of a display device according to a second embodiment of the present disclosure.
Figure 11:
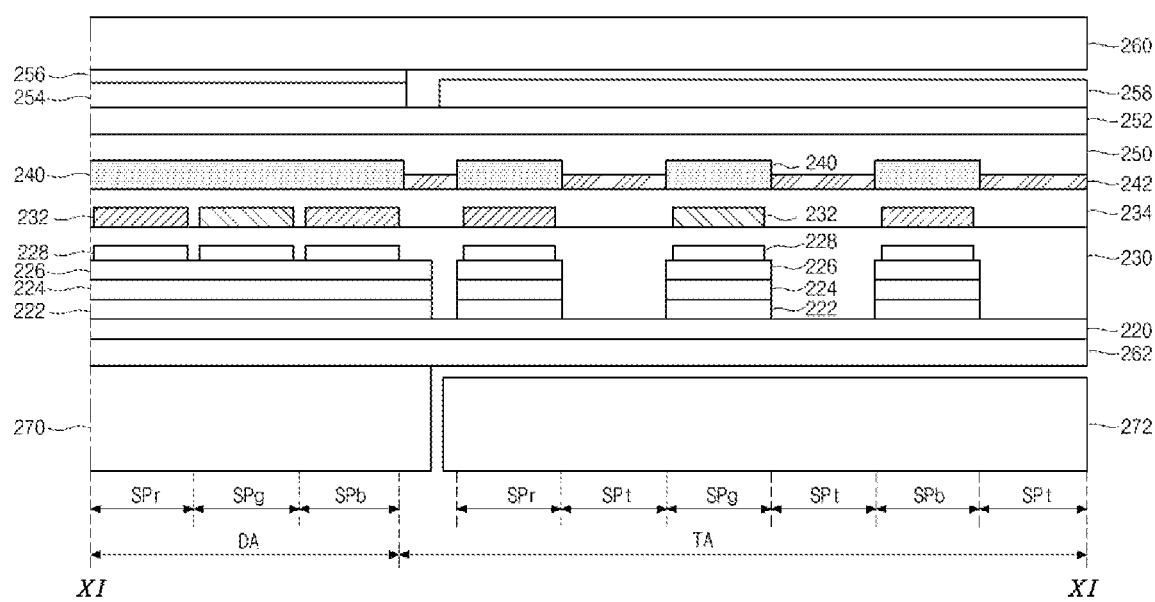
FIG. 11 is a cross-sectional view taken along a line XI-XI of FIG. 10 according to an embodiment of the present disclosure.

FIG. 10 is a magnified plan view showing a border region of a display arca and a transparent area of a display device according to a second embodiment of the present disclosure, and FIG. 11 is a cross-sectional view taken along a line XI-XI of FIG. 10 according to an embodiment of the present disclosure. An organic light emitting diode (OLED) display device of an on-cell touch type and a top emission type is exemplarily illustrated as a display device.

In FIGS. 10 and 11, a display device 210 according to a second embodiment of the present disclosure includes a display area DA used for displaying an image and sensing a touch, a transparent area TA inside the display area DA and a non-display area (not shown) surrounding the display area DA.

The display device 210 includes a display panel, a system part 270 and an auxiliary equipment 272. The display panel may transmit an information to a user through an image displaying and may receive an information from the user through a touch sensing. The system part 270 may transmit and receive a signal and a power with the display panel and the auxiliary equipment 272. The auxiliary equipment 272 may receive an information such as a shape of a subject through the display panel.

A back plate 262 supports and protects a substrate 220. The back plate 262 may include a plastic such as polyethylene terephthalate (PET) and may have a refractive index of about 1.6.

The substrate 220 is disposed on at least a part or a whole of the back plate 262, and a gate insulating layer 222, an interlayer insulating layer 224, and a passivation layer 226 are sequentially disposed in a plurality of first color subpixels of the display area DA and a plurality of second color subpixels of the transparent area TA on the substrate 220.

The substrate 220 includes the display area DA and the transparent area TA. The display area DA includes the plurality of first color subpixels such as red, green, and blue subpixels SPr, SPg, and SPb, and the transparent area TA includes the plurality of second color subpixels such as red, green, and blue subpixels SPr, SPg and SPb, and a plurality of transparent subpixels SPt alternating with the plurality of second color subpixels.

Although the red, green, and blue subpixels SPr, SPg, and SPb of the plurality of second color subpixels and the plurality of transparent subpixels SPt of the transparent area TA exemplarily alternate with each other by 1:1 correspondence along a horizontal direction in the second embodiment, the red, green, and blue subpixels SPr, SPg, and SPb of the plurality of second color subpixels and the plurality of transparent subpixels SPt of the transparent area TA may alternate with each other by 1:plurality correspondence along a horizontal direction in another embodiment.

For example, the red, green, and blue subpixels SPr, SPg, and SPb of the plurality of second color subpixels and the plurality of transparent subpixels SPt of the transparent area TA may alternate with each other by 1:3 correspondence such that the transparent area TA has an aperture ratio of about 75%.

The substrate 220 may include a glass or a plastic such as polyethylene terephthalate (PET) and may have a refractive index of about 1.6.

A plurality of thin film transistors (TFTs) such as a switching TFT Ts (of FIG. 2) and a driving TFT Td (of FIG. 2) and a storage capacitor Cs (of FIG. 2) may be disposed among the gate insulating layer 222, the interlayer insulating layer 224 and the passivation layer 226 of each of the red, green, and blue subpixels SPr, SPg, and SPb.

For example, the gate insulating layer 222 may be disposed between a gate electrode and a semiconductor layer of the switching TFT Ts and the driving TFT Td, the interlayer insulating layer 224 may be disposed between the gate electrode and a source electrode and between the gate electrode and a drain electrode of the switching TFT Ts and the driving TFT Td, and the passivation layer 226 may be disposed on the source electrode and the drain electrode of the switching TFT Ts and the driving TFT Td.

A first electrode 228 is disposed in each of the red, green, and blue subpixels SPr, SPg, and SPb of the display area DA and the transparent area TA on the passivation layer 226, and a first emission assisting layer 230 is disposed on at least a part or a whole of the substrate 220 having the first electrode 228.

The first electrode 228 may include a first layer of a metallic material having a relatively high reflectance and a second layer of a transparent conductive material having a relatively high work function.

For example, the first electrode 228 may be an anode supplying a hole to an emitting material layer 232 and may be connected to the driving TFT Td.

The first emission assisting layer 230 may include a hole injecting layer injecting a hole into the emitting material layer 232 and a hole transporting layer transporting a hole to the emitting material layer 232. The hole injecting layer and the hole transporting layer may be sequentially disposed on the first electrode 228.

The emitting material layer 232 is disposed in each of the red, green, and blue subpixels SPr, SPg, and SPb on the first emission assisting layer 230, and a second emission assisting layer 234 is disposed on at least a part or a whole of the substrate 220 having the emitting material layer 232.

The emitting material layer 232 combines a hole supplied from the first electrode 228 and an electron supplied from a second electrode 240 to emit a light.

Although the emitting material layers 232 of the red, green and blue subpixels SPr, SPg and SPb of the display area DA and the transparent area TA exemplarily include different materials to emit red, green and blue colored lights, respectively, in the second embodiment, the emitting material layers 232 of the red, green, and blue subpixels SPr, SPg and SPb of the display area DA and the transparent area TA may have the same structure of the same material to emit a white colored light and a color filter layer may be disposed on the second electrode 240 in another embodiment.

The second emission assisting layer 234 may include an electron transporting layer transporting an electron to the emitting material layer 232 and an electron injecting layer injecting an electron. The electron transporting layer and the electron injecting layer may be sequentially disposed on the emitting material layer 232.

For example, the electron injecting layer may have a thickness of about 10 Å to about 40 Å.

Each of the first and second emission assisting layers 230 and 234 may have a refractive index of about 1.8.

Although the first and second emission assisting layers 230 and 234 of the same material are exemplarily disposed on a whole of the substrate 220 in the second embodiment, the first and second emission assisting layers 230 and 234 may be selectively disposed in the red, green, and blue subpixels SPr, SPg, and SPb of the display area DA and the transparent area TA with different materials.

The second electrode 240 is disposed in the red, green, and blue subpixels SPr, SPg, and SPb of the display area DA and the transparent area TA on the second emission assisting layer 234, and a deposition preventing layer 242 is disposed in the plurality of transparent subpixels SPt of the transparent area TA on the second emission assisting layer 234.

The second electrode 240 is selectively disposed in a region where the deposition preventing layer 242 is not formed. As a result, and the second electrode 240 and the deposition preventing layer 242 may be exclusively disposed to each other.

The second electrode 240 may include a metallic material having a half transmittance and a relatively low work function.

For example, the second electrode 240 may be a cathode supplying an electron to the emitting material layer 232. The second electrode 240 may have a thickness of about 100 Å to about 200 Å and may include magnesium silver (MgAg).

The first electrode 228, the first emission assisting layer 230, the emitting material layer 232, the second emission assisting layer 234, and the second electrode 240 constitute a light emitting diode.

The deposition preventing layer 242 may include an organic material having a relatively low surface energy such that a metallic material is not adsorbed on and is detached from the deposition preventing layer 242 while the second electrode 240 is formed.

For example, the deposition preventing layer 242 may have a thickness of about 20 Å to about 300 Å.

The deposition preventing layer 242 may be formed of the same material through the same process as the first embodiment.

Since the second electrode 240 is not formed and the deposition preventing layer 242 is formed in the plurality of transparent subpixels SPt of the transparent area TA, a transmittance of the transparent area TA is improved.

For example, the plurality of transparent subpixels SPt of the transparent area TA may have a transmittance of about 94% and the transparent area TA may have an aperture ratio of about 75%. As a result, the transparent area TA without an anti-reflecting layer 258 may have a transmittance of about 71% and the transparent area TA with an anti-reflecting layer 258 may have a transmittance of about 75%.

An encapsulating layer 250 is disposed on a whole of the substrate 220 having the second electrode 240 and the deposition preventing layer 242, and a touch layer 252 is disposed on a whole of the substrate 220 having the encapsulating layer 250.

The encapsulating layer 250 prevents penetration of an oxygen or a moisture of an exterior. The encapsulating layer 250 may include a plurality of organic material layers and a plurality of inorganic material layers and may have a refractive index of about 1.8.

The touch layer 252 senses a touch. The touch layer 252 may include a plurality of touch electrodes and an insulating layer, and the insulating layer may have a refractive index of about 1.5.

Although the touch layer 252 is exemplarily disposed on the encapsulating layer 250 in the second embodiment, the touch layer 252 may be disposed inside an array layer including the gate insulating layer 222, the interlayer insulating layer 224 and the passivation layer 226 or may be omitted in another embodiment.

A polarizing layer 254 is disposed in the display area DA on the touch layer 252, and an adhesive layer 256 is disposed in the display area DA on the polarizing layer 254.

The polarizing layer 254 reduces or minimizes re-emission of an external light by reflection on the array layer and the light emitting diode. The polarizing layer 254 may include a quarter wave plate and a linear polarizing layer sequentially on the touch layer 252.

The anti-reflecting layer 258 is disposed in the transparent area TA on the touch layer 252.

The anti-reflecting layer 258 improves a transmittance of the transparent area TA by adjusting an interference according to a reflection at an interface of the touch layer 252 and the anti-reflecting layer 258.

The anti-reflecting layer 258 may be omitted in another embodiment.

A cover glass 260 is disposed on a whole of the substrate 220 having the adhesive layer 256. The cover glass 260 protects the touch layer 252, the light emitting diode and the array layer.

The back plate 262, the substrate 220, the plurality of TFTs, the light emitting diode and the cover glass 260 constitute the display panel.

The system part 270 and the auxiliary equipment 272 are disposed in the display area DA and the transparent area TA, respectively, under the back plate 262.

In the display device 210 according to a second embodiment of the present disclosure, a cutting process of removing the light emitting diode and the encapsulating layer 250 of the transparent area TA is not performed. Instead, since the second electrode 240 of the light emitting diode is selectively formed in the plurality of first color subpixels of the display area DA and the plurality of second color subpixels of the transparent area TA using the deposition preventing layer 242, a side surface of the light emitting diode and the encapsulating layer 250 is not exposed to an exterior. As a result, penetration of an external oxygen or an external moisture is reduced or minimized and deterioration such as a particle is reduced or minimized.

In addition, since a cutting process such as a laser trimming and a process of forming a groove are omitted, a fabrication process is simplified, a fabrication cost is reduced, and a productivity is improved.

Further, since the plurality of second color subpixels are disposed in the transparent area TA, a display area of the display device 210 extends and a display quality of an image is improved.

Moreover, since the light emitting diode including the second electrode 240 having a half transmissive property is disposed in the plurality of second color subpixels of the transparent area TA, a color reproducibility is improved due to a micro cavity effect and a lifetime increases.

Furthermore, since the deposition preventing layer 242 instead of the second electrode 240 is formed in the plurality of transparent subpixels SPt of the transparent area TA, a transmittance of the transparent area TA is improved.

Consequently, in the display device and the method of fabricating the display device according to the first and second embodiments of the present disclosure, since the second electrode of the light emitting diode is selectively disposed in the display area except for the transparent area using the deposition preventing layer, deterioration such as a particle is minimized, a fabrication cost is reduced, and a productivity is improved.

In addition, since the second electrode of the light emitting diode is selectively disposed in the display area and a portion of the transparent area using the deposition preventing layer, deterioration such as a particle is minimized, a fabrication cost is reduced, a productivity is improved, and an image is displayed even in the transparent area.

It will be apparent to those skilled in the art that various modifications and variation can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A display device, comprising:
   a substrate including a display area having a plurality of first subpixels, and a transparent area having a plurality of second subpixels and a plurality of transparent subpixels;
   a first electrode in each of the plurality of first subpixels and in each of the plurality of second subpixels, the first electrode on the substrate;
   a first emission assisting layer on the first electrode;
   an emitting material layer in each of the plurality of first subpixels and in each of the plurality of second subpixels, the emitting material layer on the first emission assisting layer;
   a second emission assisting layer on the emitting material layer;
   a second electrode in each of the plurality of first subpixels and in each of the plurality of second subpixels, the second electrode on the second emission assisting layer; and
   an organic material layer in the transparent area and on the second emission assisting layer,
   wherein the second electrode in each of the plurality of first subpixels and in each of the plurality of second subpixels and the organic material layer in the transparent area are on the same layer, and
   wherein the second electrode in each of the plurality of first subpixels and in each of the plurality of second subpixels and the organic material layer in the transparent area contact the second emission assisting layer.

2. The device of claim 1, wherein the first emission assisting layer includes at least one of a hole injecting layer and a hole transporting layer on the first electrode, and
   wherein the second emission assisting layer includes at least one of an electron transporting layer and an electron injecting layer on the emitting material layer.

3. The device of claim 1, wherein at least one of the plurality of second subpixels is between at least two of the plurality of transparent subpixels.

4. The device of claim 3, wherein the plurality of second subpixels and the plurality of transparent subpixels are alternately disposed in the transparent area.

5. The device of claim 1, wherein the organic material layer is only disposed in the transparent area.

6. The device of claim 1, wherein a surface energy of the second emission assisting layer is greater than a surface energy of the organic material layer and smaller than a surface energy of the second electrode.

7. The device of claim 6, wherein the second emission assisting layer has a surface energy equal to or greater than 0.5 J/m², wherein the organic material layer has a surface energy equal to or smaller than 0.2 J/m², and
wherein the second electrode has a surface energy equal to or greater than 0.5 J/m².

8. The device of claim 1, wherein the organic material layer has a glass transition temperature equal to or lower than 40° C., a refractive index equal to or greater than 1.7 with respect to a light of a wavelength of 550 nm, a light absorption rate equal to or smaller than 0.02 with respect to a light of a wavelength of 550 nm, and a thickness of 20 Å to 300 Å.

9. The device of claim 1, wherein the organic material layer includes open-ring isomer diarylethene expressed by a following CHEMICAL FORMULA 1

[CHEMICAL FORMULA 1]

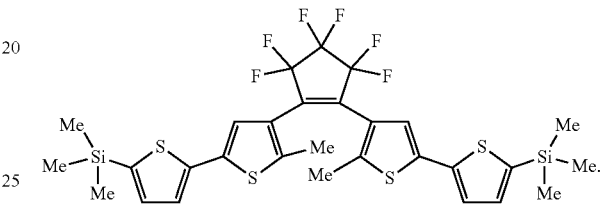

10. The device of claim 1, further comprising an encapsulating layer on the second electrode,
    wherein a side of the second electrode is directly in contact with the encapsulating layer.

11. The device of claim 1, further comprising a color filter layer disposed on the second electrode.

12. The device of claim 1, wherein the second emission assisting layer is directly on the first emission assisting layer between at least one of the plurality of first subpixels which is adjacent to the transparent area and at least one of the plurality of second subpixels which is adjacent to the display area.

13. The device of claim 1, wherein the first emission assisting layer and the second emission assisting layer are disposed on a whole of the substrate.

14. The device of claim 1, further comprising an auxiliary equipment in the transparent area under the substrate, the auxiliary equipment being a camera or a fingerprint sensor.

15. A display device, comprising:
    a substrate including a display area having a plurality of first subpixels, and a transparent area having a plurality of second subpixels and a plurality of transparent subpixels;
    a first electrode in each of the plurality of first subpixels and in each of the plurality of second subpixels, the first electrode on the substrate;
    a first emission assisting layer on the first electrode;
    an emitting material layer in each of the plurality of first subpixels and in each of the plurality of second subpixels, the emitting material layer on the first emission assisting layer;
    a second emission assisting layer on the emitting material layer;
    a second electrode in each of the plurality of first subpixels and in each of the plurality of second subpixels, the second electrode on the second emission assisting layer; and
    an encapsulating layer on the second electrode,
    wherein the second electrode has a top surface, a bottom surface and a side surface, and wherein at a boundary between at least one of the plurality of second subpixels and at least one of the plurality of transparent subpixels, a side surface of the second electrode is directly in contact with the encapsulating layer, wherein the second electrode in one of the plurality of first subpixels is connected to the second electrode in the other one of the plurality of first subpixels, and wherein the second electrode in one of the plurality of second subpixels is separated from the second electrode in the other one of the plurality of second subpixels in a cross-sectional view.

16. The device of claim 15, further comprising a touch layer on the encapsulating layer, wherein the touch layer is continuously disposed in both the display area and the transparent area.

17. The device of claim 16, further comprising a polarizing layer on the touch layer, wherein a size of the polarizing layer is less than the size of the substrate.

18. The device of claim 17, wherein the polarizing layer is a film type of a size corresponding to the display area.

19. The device of claim 17, further comprising an anti-reflecting layer in the transparent area, wherein the polarizing layer and the anti-reflecting layer are on the same layer.

20. The device of claim 19, wherein the anti-reflecting layer is spaced apart from the polarizing layer.

* * * * *